United States Patent [19]

Reese et al.

[11] 4,280,070

[45] Jul. 21, 1981

[54] BALANCED INPUT BUFFER CIRCUIT FOR SEMICONDUCTOR MEMORY

[75] Inventors: Edmund A. Reese, Sugar Land; Lionel S. White, Jr., Houston; Joseph C. McAlexander, III, Sugar Land, all of Tex.

[73] Assignee: Texas Instruments Incorporated, Dallas, Tex.

[21] Appl. No.: 953,145

[22] Filed: Oct. 20, 1978

[51] Int. Cl.³ .......................... H03K 3/26; H03K 5/00
[52] U.S. Cl. .................................. 307/279; 307/238.5
[58] Field of Search .................................. 307/279, 238

[56] References Cited

U.S. PATENT DOCUMENTS

3,902,082   8/1975   Proebsting et al. ................. 307/279

Primary Examiner—Harold A. Dixon
Attorney, Agent, or Firm—John G. Graham

[57] ABSTRACT

A random access read/write MOS memory device employs bistable latch or buffer circuits as the address inputs, data inputs, and the like. The buffers function to latch the data or address to allow the inputs to change states. The buffer is activated by TTL level inputs, exhibits low capacitance at its input, and switches states fast enough to allow rapid multiplexing of the addresses. Noise immunity is improved by selective implants of some of the transistors, and by use of filter capacitors connected between input nodes and Vss rather than Vdd.

10 Claims, 9 Drawing Figures

BALANCED INPUT BUFFER CIRCUIT FOR SEMICONDUCTOR MEMORY

RELATED CASES

This application discloses subject matter disclosed and claimed in application Ser. No. 953,052, filed herewith by the inventors hereof and assigned to TEXAS INSTRUMENTS.

BACKGROUND OF THE INVENTION

This invention relates to semiconductor memory devices and more particularly to an improved input buffer circuit for an MOS random access read/write memory.

Semiconductor memory devices of the type made by the N-channel silicon-gate MOS process and employing one transistor dynamic cells are now the most widely used in computers and digital equipment. A continuing problem in these devices is the input buffer circuits which must detect TTL level address signals, data signals, or controls, and latch these signals so the inputs can change. As the operating speed or access time of memory devices increases, the constraints upon the design of input buffers increases because the rate of switching of the multiplexed addresses is faster so less time is allowed for latching, and noise on the address lines is at a higher level. Use of 5 V rather than 12 V power supplies lowers MOS threshold voltages and causes more difficulty in matching TTL logic levels. Examples of prior input buffers are disclosed in U.S. Pat. No. 4,031,415 issued to Redwine and Kitagawa, and U.S. Pat. No. 4,110,639 issued to Redwine, both assigned to Texas Instruments.

It is the principal object of this invention to provide improved address or data input buffers for a high speed MOS RAM, particularly for a multiplexed-address read/write memory which has TTL compatable inputs. Another object is to provide address buffers which latch rapidly without boosting the inputs and which are noise immune.

SUMMARY OF THE INVENTION

In accordance with one embodiment of the invention, a random access read/write MOS memory device employs bistable latch or buffer circuits as the address inputs, data inputs, and the like. The buffers function to latch the data or address to allow the inputs to change states. The buffer is activated by TTL level inputs, exhibits low capacitance at its input, and switches states fast enough to allow rapid multiplexing of the addresses. Noise immunity is improved by selective implants of some of the transistors, and by use of filter capacitors connected between input nodes and Vss rather than Vdd.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 2a-2g are graphic representations of voltage vs. time or other conditions vs. time existing for various parts of the device of FIG. 1;

FIGS. 4a-4g are graphic representations of voltage vs. time existing in various parts of the circuit of FIG. 3;

FIGS. 6a-6f are graphic representations of voltage vs. time existing at various parts of the circuit of FIG. 5.

DETAILED DESCRIPTION OF SPECIFIC EMBODIMENT

The Memory System

Figure 1:
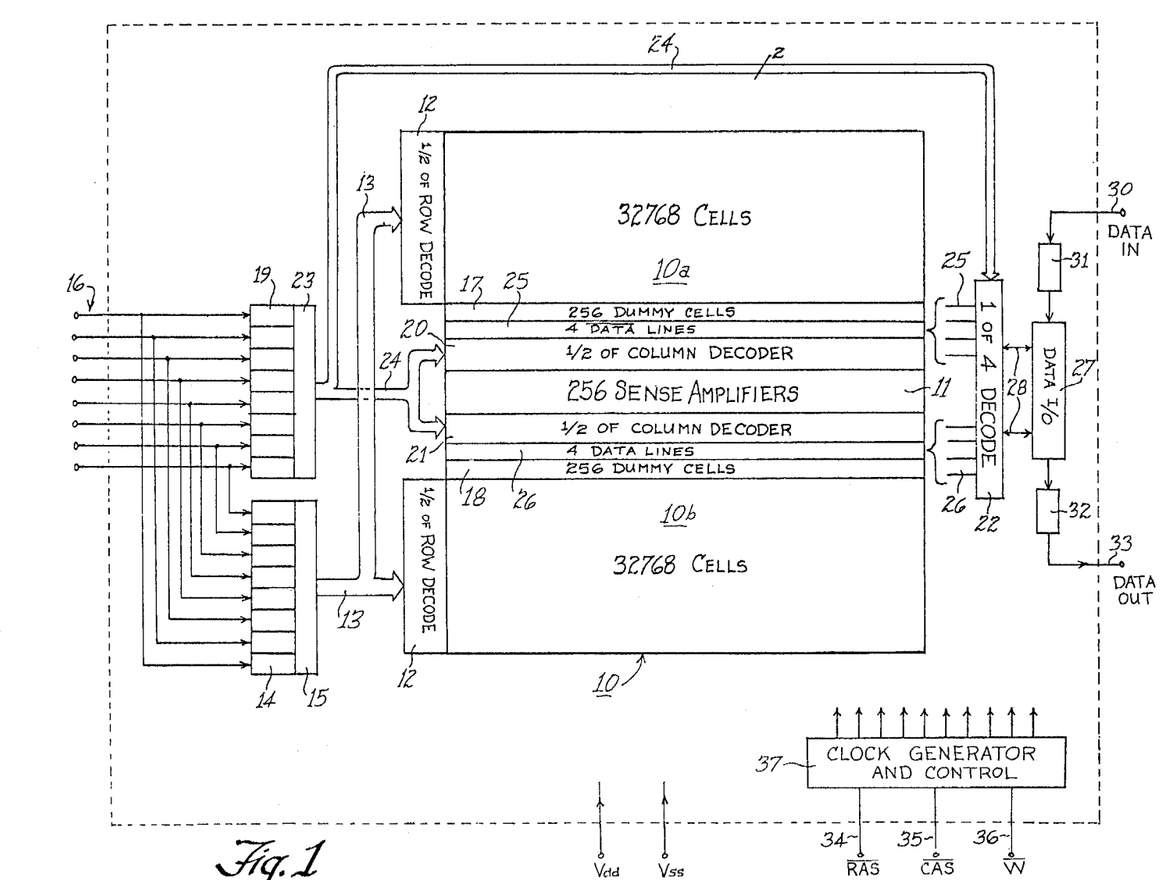
FIG. 1 is an electrical diagram in block form of a semiconductor dynamic memory device which may use the sense amplifiers of the invention.

Referring to FIG. 1, a memory device which may utilize the input buffers of the invention is illustrated in block diagram form. This is a random access, read/write memory of the dynamic type, made by an N-channel, self-aligned, silicon gate, double-levelpolysilicon, MOS process. All of the memory device of FIG. 1 is included in one silicon chip of about 1/30 of a square inch in size which usually would be mounted in a standard dual-in-line package having sixteen pins or terminals. The device includes in this example an array 10 of 65,536 memory cells, with the array split into two halves 10a and 10b of 32,768 cells each, in a regular pattern of 256 rows and 256 columns. Of the 256 row or X lines, there are 128 in the array half 10a and 128 in the half 10b. The 256 column or Y lines are each split in half with one half being in each of the halves 10a and 10b. There are 256 sense amplifiers 11 in the center of the array; these are differential type bistable circuits made according to the invention disclosed and claimed in U.S. Patent Application S.N. 944,822, filed Sept. 22, 1978 now U.S. Pat. No. 4,239,993 and assigned to Texas Instruments. Each sense amplifier is connected in the center of a column line, so 128 memory cells are connected to each side of each sense amplifier by a column line half. The chip requires only a single 5 V supply Vdd, along with a ground terminal Vss. No internal charge pump is needed because no substrate bias is employed.

A row or X address decoder 12, split into two halves, is connected by sixteen lines 13 to eight address buffers or latches 14 via output circuits 15. The buffers 14 are made according to the invention and will be described in detail below. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 18 is activated. The address signals on the input lines 16 are multiplexed; the Y address is also applied to these input lines and is latched into a set of eight buffers 19, also made according to the invention, from which the address is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/0 control circuit 27 via a pair of lines 28. A single bit data input is applied by an input terminal 30 to a data input latch 31, and the output of this latch is coupled to the data I/0 control 27. The latch 31 may use the invention in that it may be of the same circuit design as the address buffer circuits 14 and 19. One-bit data output is connected from the data I/0 control 27 through a buffer 32 to a data out terminal 33.

Figure 2:
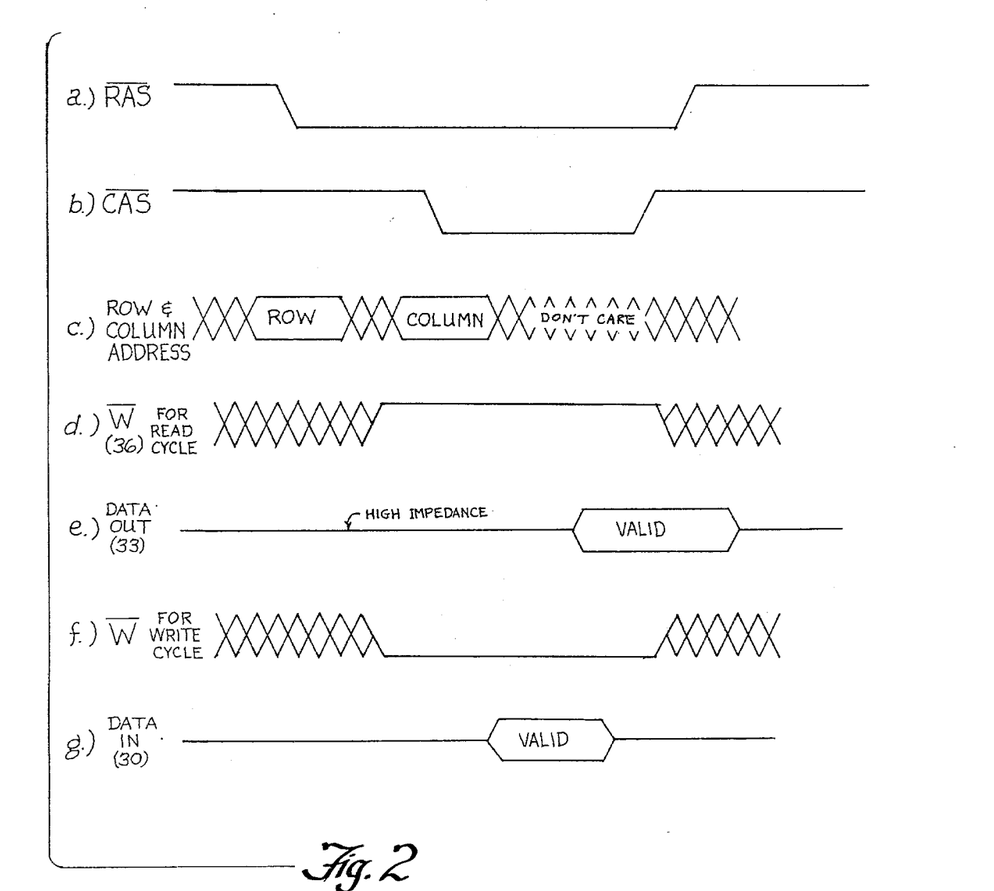
Figure 4:
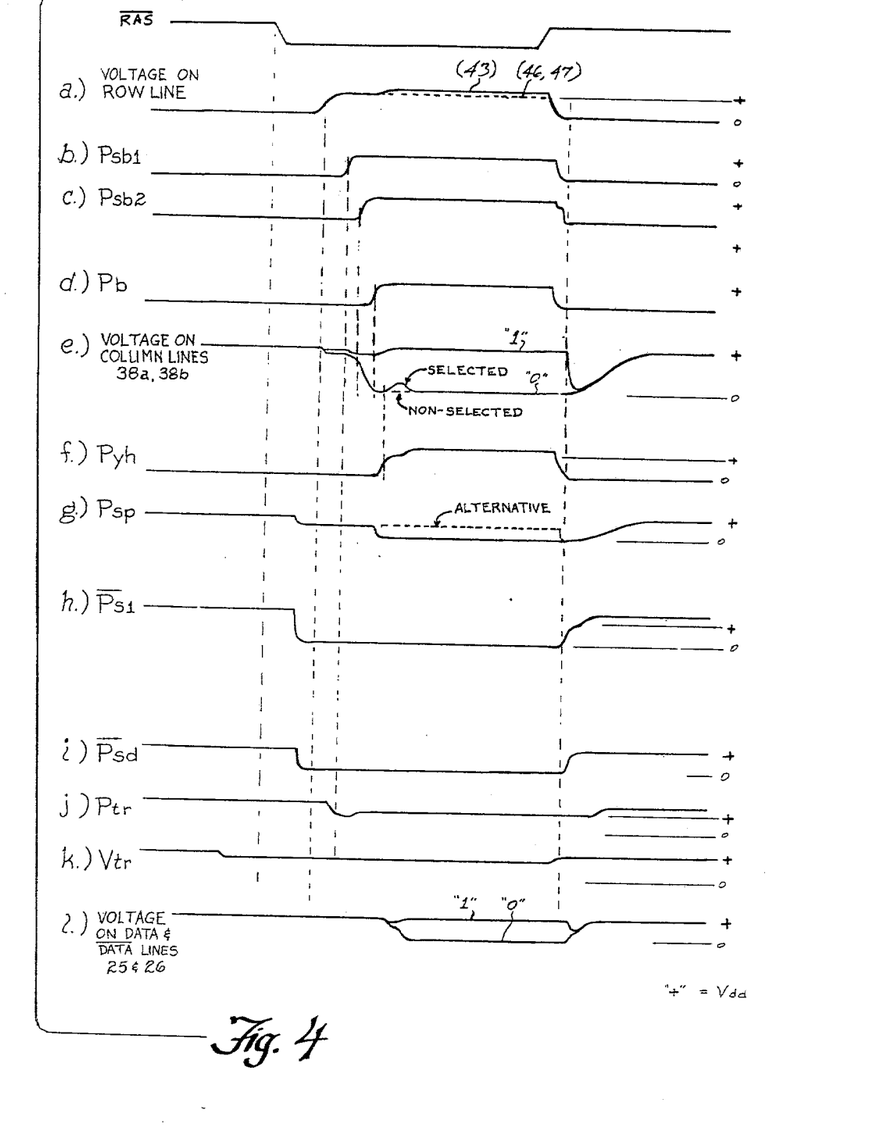
Figure 6:
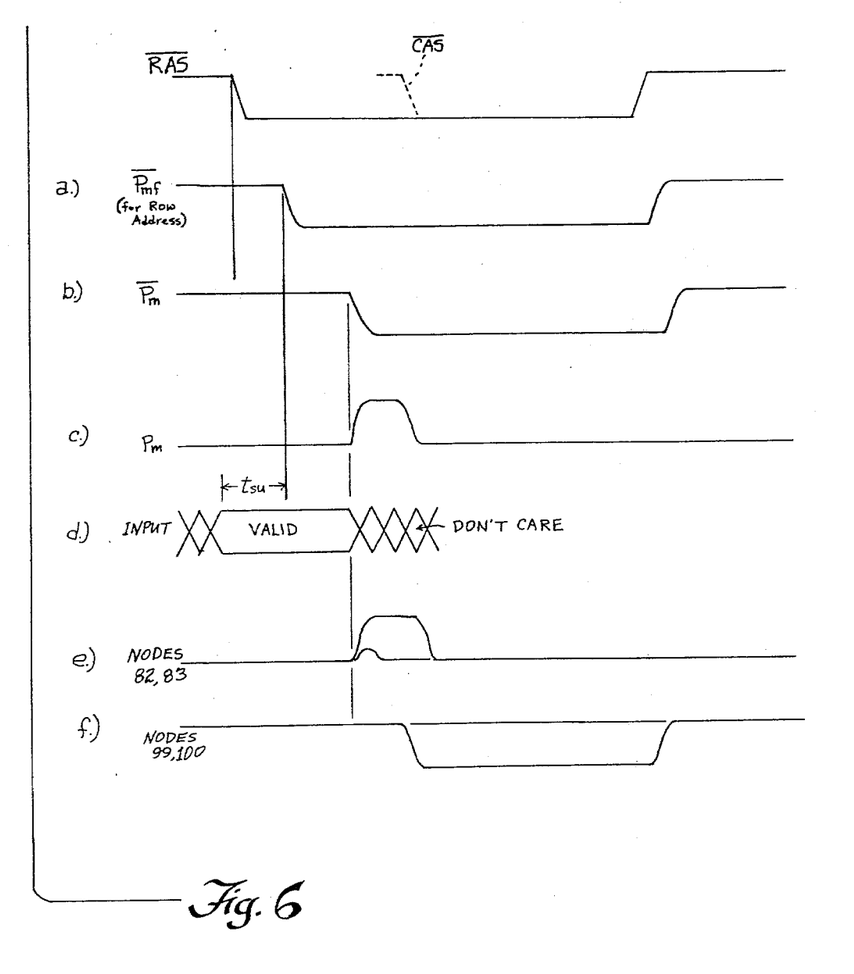

The X address must appear on the inputs 16 when a row address strobe signal, referred to as $\overline{RAS}$ (seen in FIG. 2a, 4 and 6, is applied to an input 34. Likewise, the Y address must appear during a column address strobe signal $\overline{CAS}$ on an input 35. A read/write control $\overline{W}$ on an input 36 is the other control signal for the device. These three inputs are applied to clock generator and control circuitry 37 which generates a large number of clocks and control signals to define the operation of various parts of the device. When $\overline{RAS}$ goes low as seen in FIG. 2a, clocks derived from $\overline{RAS}$ cause the buffers 14 to accept and latch the eight bits then appearing on the input lines 16. When $\overline{CAS}$ goes low as seen in FIG. 2b then clocks generated in the circuitry 37 cause the buffers 19 to latch on the Y address on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write cycle, the $\overline{W}$ signal must be low as seen in FIG. 2f and the data-in bit must be valid during the time seen in FIG. 2g.

The Cell Array and Sense Amplifiers

Figure 3:
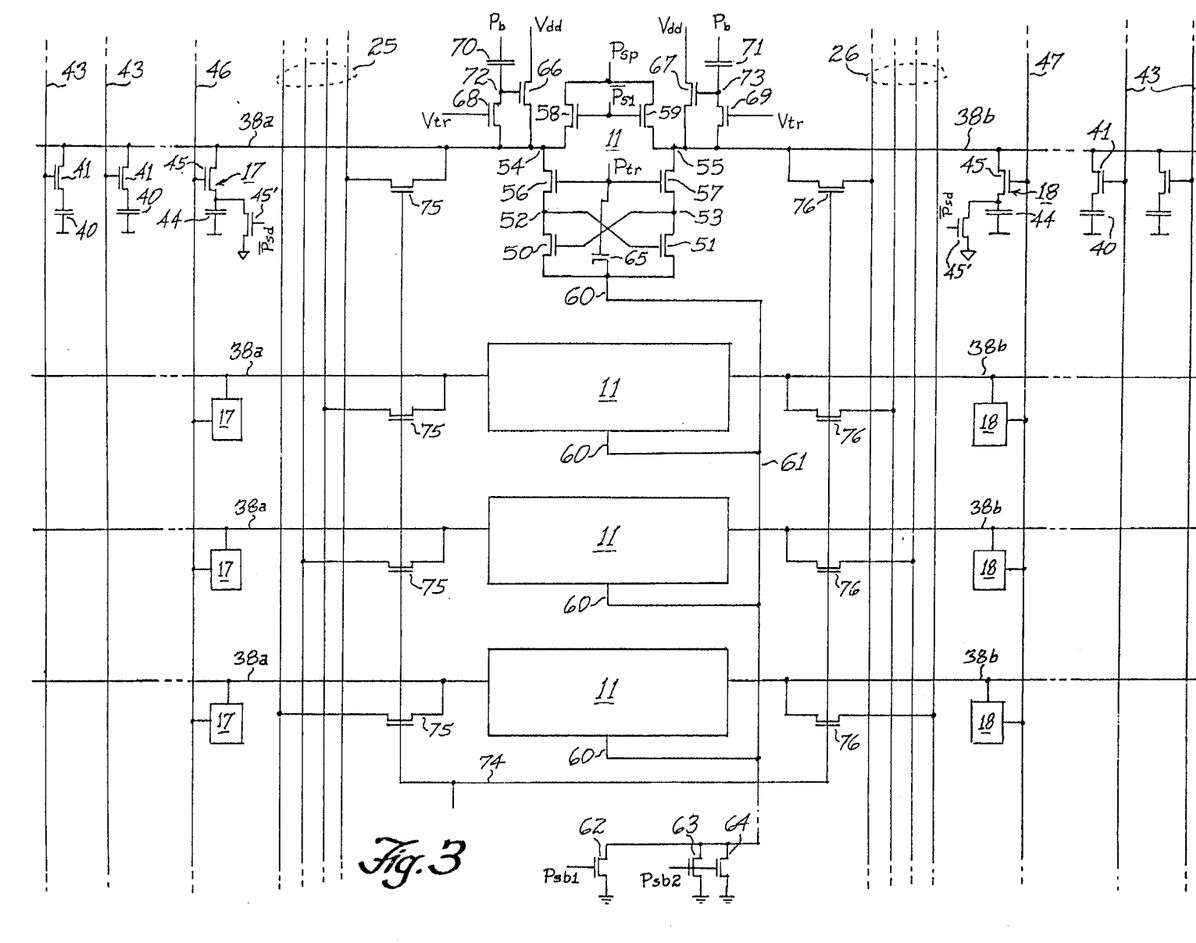
FIG. 3 is an electrical schematic diagram of the cell array in the device of FIG. 1.

In FIG. 3, a portion of the cell array is shown in schematic form. Four identical sense amplifiers 11 are positioned at the center of the array, connected to four column line halves 38a or 38b. Sixty-three other sets of four sense amplifiers and column lines are included in the array. Connected to each column line half 38a or 38b are 128 one-transistor cells each having a storage capacitor 40 and a transistor 41. The cells are of the type described in pending U.S. Pat. applications Ser. No. 648,594, filed Jan. 12, 1976 and Ser. No. 722,841, filed Sept. 13, 1976 by C-K Kuo, both assigned to Texas Instruments, or U.S. Pat. No. 4,012,757. Row lines 43 which are the outputs of the row decoders 12 are connected to the gates of all of the transistors 41 in each row; there are 256 identical row lines 43 in the array. Also connected to each column line half 38a or 38b is a dummy cell 17 or 18 which consists of a storage capacitor 44, an access transistor 45 and a grounding transistor. The gates of all dummy cells in a row are connected to a line 46 or 47. When the X address selects one of the lines 43 on the left, the associated transistor 41 is turned on to connect the capacitor 40 for this selected cell to the column line half 38a, while at the same time the dummy cell select line 47 on the opposite side is activated, connecting the capacitor 44 in one of the cells 18 to the column line half 38b. The dummy cell capacitance 44 is about ⅜ that of the storage cell capacitance 40. The dummy cell is precharged to a logic zero before every active cycle.

The sense amplifier consists of a bistable circuit having a pair of driver transistors 50 and 51, each with its gate connected to the drain 52 or 53 of the other to provide a cross-coupled flip-flop. The drains 52 and 53 are connected to nodes 54 and 55 at the ends of the lines 38a and 38b through the source-to-drain current paths of a pair of coupling transistors 56 and 57. The gates of the transistors 56 and 57 are both connected to a source of a clock voltage Ptr, seen in FIG. 4j. The nodes 54 and 55 and column line halves 38a and 38b are precharged through the source-to-drain current paths of a pair of transistors 58 and 59 connected to a voltage source Psp, shown in FIG. 4g. The gates of the transistors 58 and 59 are connected to a clock voltage $\overline{Ps1}$ seen in FIG. 4h.

The sources of the driver transistors 50 and 51 are connected together at a node 60, and this node 60 is connected by a line 61 to the same node in all of the 256 sense amplifiers 11 in the array. The line 61 is connected to a transistor 62 and a dual channel transistor 63 and 64 which function as grounding paths. The gate of the transistor 62 is connected to a clock Psb1 seen in FIG. 4b, and the common gate of the dual transistors 63 and 64 is connected to a clock Psb2 seen in FIG. 4c. This grounding arrangement is similar to U.S. Pat. No. 4,081,701, assigned to Texas Instruments. The two current paths of the dual transistor 63 and 64 turn on at different times because the channel area of the transistor 64 is ion implanted to raise its threshold so that it turns on later than the transistor 63 even though the same clock is applied to its gate. The dual transistor 63 and 64 (actually one large transistor with different channel implants) is much larger than the transistor 62, in channel width to length ratio. Alternatively, the channel length of 62 would be longer than that of 63.

The column line halves 38a and 38b along with nodes 54 and 55 are precharged to near Vdd during the precharge part of an operating cycle when both Psp and $\overline{Ps1}$ are high. At this time Ptr is high so the nodes 52 and 53 are precharged also. The transistors 50 and 51 are off because the transistors 62-64 are all off, Psb1 and Psb2 being low. After $\overline{Ps1}$ has gone low, turning off the transistors 58 and 59, and before Psb1 goes high, an X address reaches one of the lines 43 at the same time that one of the dummy cell address lines 46 or 47 is activated. This causes an imbalance in the voltage on the nodes 54 and 55, and the same differential is coupled to the nodes 52 and 53 because the voltage Ptr is higher than Vdd. Then, when Psb1 goes high and the small transistor 62 turns on, the sensing operation is initiated and the nodes separate more as the bistable circuit including the transistors 50 and 51 goes toward a stable condition with one transistor conducting and the other cut off. A slight delay from Psb1, the clock Psb2 goes high (FIG. 4c) to complete the sensing operation by latching the bistable circuit and obtaining a good one/-zero set on opposing digit lines (FIG. 4e). By capacitor 65 along with the parasitic capacitances of the transistors 56 and 57, the voltage Ptr is dynamically level shifted from greater than Vdd (FIG. 4j down to Vdd; the drop in voltage on the node 60 toward Vss as Psb1 then Psb2 go high is coupled to the gates of the transistors 56 and 57.

An active pull-up circuit is employed in the sense amplifier to allow storage of a full Vdd level. This circuit comprises a pair of pull-up transistors 66 and 67 connecting the nodes 54 and 55 to Vdd, along with control transistors 68 and 69 connecting the gates of the transistors 66 and 67 to the nodes 54 and 55, and capacitors 70 and 71 connecting the gates to a boosting clock Pb (FIG. 4d) occurring after Psb2. The gates of the transistors 68 and 69 are connected to a trap voltage Vtr (FIG. 4k which stays at a level of about 1 Vt below Vdd during the active part of the cycle then at Vdd during the precharge part.

After the sensing operation is essentially completed and Psb2 has come on to render first the low threshold transistor 63 then after a slight delay the higher threshold transistor 64 conductive, a definite logic one and logic zero are set up on the column lines 38a and 38b. Then, about four ns after Psb2 goes high, the selected X line 43 (but not the dummy cell select line) is slowly boosted to a level of Vdd+Vt as seen in FIG. 4a to permit restoration of a full Vdd level in the capacitor 40 for the selected cell. At the same time the X line 43 is being boosted, the clock Pb (FIG. 4d) goes high to activate the active load circuits. The clock Pb causes level shift at either node 72 or 73 via the gated capacitors 70 and 71. Only one of these nodes will have retained a logic one because the column lines (FIG. 4e) will be near the one/zero set at this time; conduction through the transistor 68 or 69 for the zero-going side will discharge node 72 or 73 and cause the gated capacitor 70 or 71 to exhibit very little capacitance so Pb will not charge the node 72 or 73 for this side. The other node 72 or 73 which retained a one, at near Vdd, will be shifted to greater than Vdd thereby allowing this column line half to be pulled back up to Vdd through transistor 66 or 67. At the same time as Pb occurs, the clock Psp is pulled to Vss.

Selection of one group of four of the 256 column lines 38a and 38b by a Pyh (FIG. 4f voltage occurs a slight delay from when Psb2 goes high. The one-of-64 column decoder 20 and 21, physically located in the space between the sense amplifiers 11 and the data and data bar lines 25 and 26, produces only one Pyh signal on a line 74 to activate only one set of four transistors 75 coupling nodes 54 to lines 25 and one set of four transistors 76 coupling nodes 55 to lines 26. The remaining sixty-three sets of sense amplifiers 11, although operative for refresh on every read or write cycle, will not be coupled to the data and data bar lines because the Pyh signal on the line 74 will be low for these.

The Input Buffer Circuit

Figure 5:
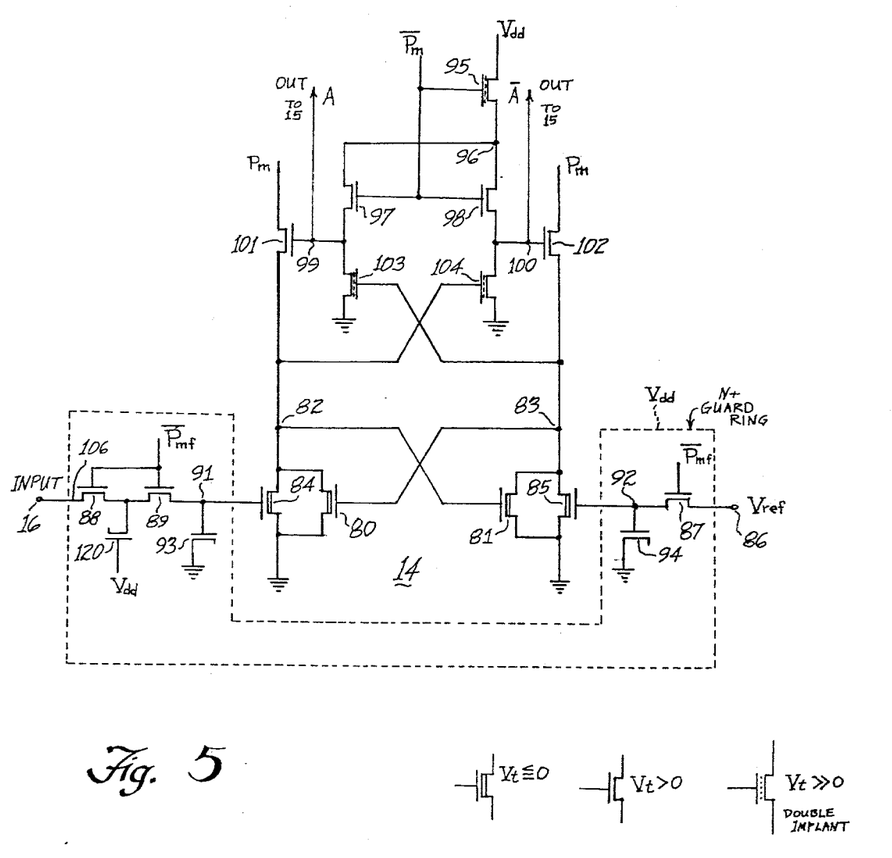
FIG. 5 is an electrical schematic diagram of a part of the device of FIG. 1 showing the input buffer circuit of the invention in detail.

With reference to FIG. 5, an input buffer circuit 14 according to the invention is illustrated. This circuit consists of a balanced flip-flop including a pair of driver transistors 80 and 81 with the drains at nodes 82 and 83 being cross-coupled to the opposite gates to provide bistable operation. Input transistors 84 and 85 are connected in parallel with the driver transistors. A dc reference voltage of about 1.5 V is connected to the gate of the transistor 85 via a line 86 and a transistor 87. The input signal to be detected, amplified and latched upon is applied via an input terminal 16 (or inputs 30 or 36) through a pair of series transistors 88 and 89 to the gate of the transistor 84. The reference voltage is selected to be half way between the worst case TTL low level of 0.8 V and the worst case TTL high level of 2.2 V. The input signal and the reference voltage are latched onto nodes 91 and 92 and held on the capacitors 93 and 94 when a $\overline{Pmf}$ clock goes to Vss. $\overline{Pmf}$, as applied to the gates of transistors 87, 88 and 89, is seen in FIG. 6a. In the prior art in order to get good conduction through the transistors 84 and 85 and thereby set the flip-flop, the voltage at the nodes 91 and 92 was boosted above the threaded voltage by capacitors connecting these nodes to a special clock, and device sizes and physical layout were kept balanced and symetrical to maintain reliable operation. Different methods are used in the present invention, as will be explained.

The output stage of the buffer functions to sense the change in voltage on the nodes 82 and 83 when the flip-flop operates. A transistor 95 is connected between Vdd and a node 96, which in turn is connected through the source-to-drain paths of a pair of transistors 97 and 98 to nodes 99 and 100. The gates of all three of these transistors 95, 97 and 98 are connected to a $\overline{Pm}$ clock as seen in FIG. 6b. Thus, during the precharge part of the cycle, when $\overline{Pm}$ is high, the internal nodes are precharged; the transistors 95, 97 and 98 are on, which equalizes the voltages on the nodes 99 and 100 and precharges these nodes to a level of Vdd-Vt. At the time $\overline{Pm}$ is high and the nodes 99 and 100 are high, Pm, seen in FIG. 6c, is at a low level near or equal to Vss. Transistors 101 and 102, connected between the Pm clock and nodes 82 and 83, are on when Pm is high, precharging the nodes 82 and 83 to a low level or Vss. This holds a pair of transistors 103 and 104 off. No dc current flows in the buffer circuit.

The 1.5 V reference voltage is applied to the node 92 through the transfer and latching transistor 87 when $\overline{Pmf}$ is high, while the TTL signal input level is applied to the node 91 through transistors 88 and 89. The input will have a set up time tsu as seen in FIG. 6d, representing the time that the input signal must be valid before $\overline{Pmf}$ goes low, allowing the capacitance of the node 91 to be fully charged. When the $\overline{Pmf}$ clock goes low the transistors 87, 88 and 89 turn off to trap the TTL level on the node 91 and Vref level on the node 92. A slight dip in the voltage levels on the nodes 91 and 92 will result due to overlap capacitance coupling from the gates of the transistors 87–89. As Pm goes high, transistors 101 and 102 can begin to be conductive; if the voltage on one or both of the nodes 91 and 92 is above Vt for 84 or 85, the transistors 84 and/or 85 can be conductive. More current will flow through the transistor with the highest gate voltage. The voltage on both nodes 82 and 83 will start to rise with Pm as seen in FIG. 6e. If a TTL "1" level is applied to the input 16 and latched on the node 91, then the transistor 84 will conduct more at this point than transistor 85. The node 82 will be pulled to Vss, turning off transistor 81 and allowing the node 83 to continue to rise, latching the flip-flop. The transistor 104 will be off and the transistor 103 on, leaving node 100 at its precharged high level of Vdd-Vt, and node 99 will be discharged to Vss. The nodes 99 and 100 are the outputs of the first stage of the input buffer 14. The current drive capability of the transistors 101 and 102 is limited, so typically two more buffer stages, represented by the output stages 15 or 23, are used to drive the address decoders with the A and $\overline{A}$ inputs, for example.

Operation for a "0" level TTL input is similar but the flip-flop latches in the opposite state. The node 92 will be higher than the node 91 after $\overline{Pmf}$ goes low. The transistor 85 will pull the node 83 to Vss, turning off transistor 80. This allows the node 82 to continue to rise with Pm. The transistor 104 will turn on, discharging the node 100 while transistor 103 will be off allowing the node 99 to stay high.

As thus far described, the input buffer is very similar to the prior art buffers as used in the 4116 memory devices, for example.

In accordance with one feature of the invention, low Vt or depletion mode transistors are used as the input transistors 84 and 85. This eliminates the need for booting the nodes 91 and 92. The transistors 84 and 85 are designed to have a negative operating threshold voltage and so the transistors will be on after $\overline{Pmf}$ goes low. That is, these transistors are implanted or otherwise treated in the manufacturing process to exhibit threshold voltages of about zero or slightly negative, using standard ion implant Vt adjust, for example. The transistors 103 and 104, on the other hand, are double implanted to provide a threshold voltage of about 0.8 V or above. One TTL level is 0.8 V. The other transistors 87, 88, 89, 97, 98, 101 and 102 are of the standard "enhancement mode" type like that of access transistors 41 in the memory array and sense amplifier transistors 50, 51. All these enhancement mode transistors have an intermediate threshold, greater than that of transistors 80, 81, 84 and 85, but less than that of transistors 103 and 104. The higher threshold of transistors 103 and 104 functions to delay the turn on of these transistors until node 82 or 83 has increased to a higher level then would be required if all devices had the same threshold, thereby reducing the effect of the voltage noise bump on nodes 82 and 83 when Pm rises as seen in FIG. 6e. The transistor 95 is designed to have a higher threshold than the transistors 97 and 98. This is accomplished by double implant adjust or by using a narrow channel width and longer channel length. Transistors 97 and 98 will reamin in the triode region of operation even when the transistor 95 is in saturation. Also, with transistors 97 and 98 having a lower threshold, the nodes 99 and 100 can be precharged to Vdd minus the threshold voltage of transistor 95. Taking into account the body effect, transistors 97 and 98 turn on ahead of transistor 95 when Pm goes high. This permits the nodes 99 and 100 to begin equalizing before they begin to be precharged through transistor 95.

The capacitors 93 and 94 are connected from the nodes 91 and 92 to Vss rather than to Vdd as was done in the prior art. A noise spike on Vss will level shift the source electrodes of transistors 84 and 85 and will increase the threshold of these transistors due to the body effect. With the capacitors 93 and 94 using Vss as one electrode, this noise couples equally into nodes 91 and 92 and increases the gate voltage by the amount of the increased source voltage thus keeping the gate-to-source voltage constant. Therefore, this added immunity will permit practical sensing even with noise occurances.

The clock Pm seen in FIG. 6c is a pulsed signal to minimize the time that a dc current path exists from a Vdd level to Vss through either transistors 101 and 84 or transistors 102 and 85.

Figure 7:
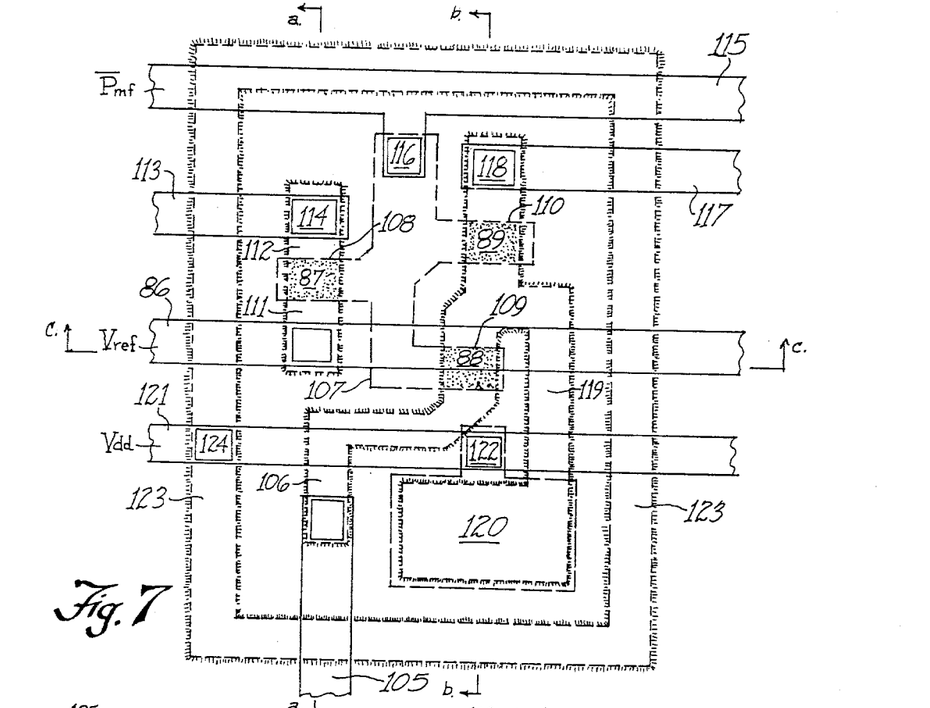
FIG. 7 is a plan view of a small part of a semiconductor device, greatly enlarged, containing the input buffer of the invention.
Figures 7A, 7B, 7C:
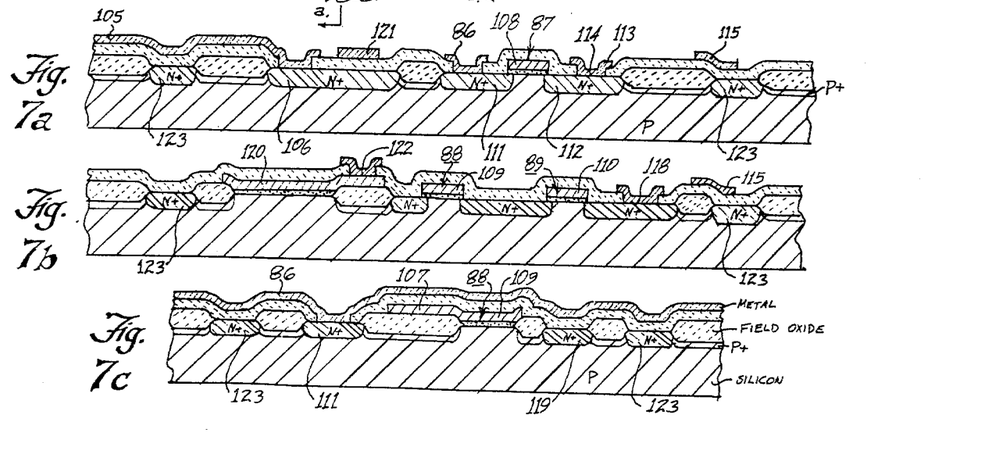

FIG. 7 shows a layout of a small part of a semiconductor chip which contains all of the 64K memory of FIG. 1 and its peripheral circuitry. FIG. 7 includes only a portion of one of the sixteen address buffers 14 and 19, the dimensions of the part shown being about one mil by two mils. The entire chip is about 150×225 mils. An input pad 16 is connected by a metal line 105 to one end of an elongated irregularly-shaped N+ moat region 106 which contains the sources and drains of the transistors 88 and 89. The gates of these two transistors, as well as the gate of the transistor 87, are defined by a polycrystalline silicon segment 107. Extended portions 108, 109 and 110 of the segment 107 provide the gates of the transistors 87, 88 and 89, respectively. The reference voltage Vref supply 86 is a metal line connected to the source 111 of the transistor 87, while the drain 112 of this transistor is connected by a metal line 113 to the gate of the input transistor 85 (not shown), via a metal-to-moat contact 114. The $\overline{Pmf}$ clock input is a metal line 115 connected to the polysilicon segment 107 at a metal-to-poly contact 116. One end of the moat 106, at the drain of the transistor 89, is connected to the gate of the transistor 84 by a metal line 117 and a metal-to-moat contact 118. An extended part 119 of the moat 106, integral with the drain of transistor 88 and the source of transistor 89, provides the lower plate of a capacitor 120. The upper plate of this capacitor is defined by a polysilicon segment, which is connected to Vdd via a metal strip 121 through a metal-to-poly contact 122. Surrounding all of these elements is an N+ diffused moat region 123 which functions as a guard ring to collect minority carrier electrons that might be injected into the silicon substrate by noise sources. The guard ring region 123 is connected to Vdd at a metal-to-moat contact 124.

In this description of FIG. 7, the term moat is used to mean the area where thick field oxide is not grown, so it is the area covered by a nitride oxidation mask in the field oxidation step of the manufacturing process. So, the moat includes all of the N+ diffused regions as well as the channel regions under gate oxide, i.e., all active areas.

It is of note that the circuit of the invention is of reduced complexity compared to previous input buffers. The need for booting capacitors and the delay circuit for generating booting signals is eliminated. This reduced component count results in a smaller layout. Also, critical clock timing is simplified compared to the prior art which required booting of the input and reference nodes before the bistable circuit could be switched, setting constraints on the clock timing. In the circuit of the invention, as soon as $\overline{Pmf}$ goes off, the data in is latched and the bistable circuit can begin switching. Not only is the timing simplified, but also switching time is faster. The addresses A, $\overline{A}$ are present on the lines 13 or 24 in a shorter time, i.e., less propagation delay, after the address is present on the lines 16 and $\overline{RAS}$ or $\overline{CAS}$ occurs. Further, the increased current conduction at lower voltages due to the reduced Vt of the transistors 80, 81, 84 and 85 provides faster switching time. Noise immunity is increased because of the high Vt of the transistors 103 and 104; the noise on the nodes 82 and 83 when the clock Pm goes high is less likely to be reflected in the output. Also, the immunity to noise on Vss is improved by the fact that the capacitors 93 and 94 are connected to Vss rather than Vdd.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed is:

1. An input buffer circuit for a semiconductor memory of the type having a large number of enhancement mode transistors, comprising:
   a bistable differential voltage detector having first and second field effect transistors with the gates of the transistors providing inputs to the detector, means for coupling an input terminal to the gate of one of said transistors, said first and second field effect transistors having a threshold voltage significantly less than that of said enhancement mode transistors.

2. A circuit according to claim 1 wherein the detector has a pair of outputs, and third and fourth field effect transistors having gates connected to said outputs.

3. A circuit according to claim 1 wherein the detector includes a pair of field effect transistors each of which has a source-to-drain path in parallel to a separate one of the first and second transistors, each of said pair of field effect transistors being cross-coupled with the other and having a threshold voltage about the same as that of the first and second transistors.

4. A circuit according to claim 1 wherein the gates of said first and second field effect transistors do not have boosting signals coupled thereto for raising the input level, and wherein no substrate bias is provided for the transistors.

5. A circuit according to claim 2 wherein fifth and sixth field effect transistors are included in the detector, each of the first through sixth field effect transistors having a source-to-drain path and a gate, the source-to-drain paths of the first and third transistors being connected in a series, the source-to-drain paths of the second and fourth transistors being connected in series, the source-to-drain paths of the fifth and sixth transistors separately connecting the gates of the third and fourth transistors to reference potential.

6. A circuit according to claim 5 wherein the threshold voltage of the fifth and sixth transistors is significantly higher than that of the third and fourth transistors.

7. A circuit according to claim 6 wherein the third and fourth transistors couple a clocked supply voltage to the first and second transistors.

8. A circuit according to claim 7 including seventh and eighth field effect transistors, each having a source-to-drain path and a gate, the source-to-drain path of the seventh transistor coupling the reference voltage to the gate of the first transistor, the source-to-drain path of the eighth transistor connecting the input terminal of the gate of the second transistor, and a clock voltage source connected to the gates of the seventh and eighth transistors and having a tracking edge occurring prior to said clocked supply voltage.

9. A circuit according to claim 8 wherein the gates of the third and fourth transistors are precharged prior to the rise time of said clocked supply voltage.

10. A circuit according to claim 9 wherein the pulse width of said clocked supply voltage is much shorter than an active operating cycle of the input buffer circuit.

* * * * *